United States Patent
Jung et al.

(10) Patent No.: US 7,576,613 B2
(45) Date of Patent: Aug. 18, 2009

(54) REGULATED CASCODE CIRCUITS AND CMOS ANALOG CIRCUITS INCLUDING THE SAME

(75) Inventors: Mu-Kyeng Jung, Suwon-si (KR); Soon-Kyun Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 159 days.

(21) Appl. No.: 11/709,955

(22) Filed: Feb. 23, 2007

(65) Prior Publication Data
US 2007/0200632 A1 Aug. 30, 2007

(30) Foreign Application Priority Data
Feb. 24, 2006 (KR) .................. 10-2006-0018026

(51) Int. Cl.
*H03F 3/04* (2006.01)
(52) U.S. Cl. .................. 330/311; 330/264; 330/277
(58) Field of Classification Search .................. 330/311, 330/264, 277
See application file for complete search history.

(56) References Cited
U.S. PATENT DOCUMENTS

| | | | |
|---|---|---|---|
| 5,142,696 A * | 8/1992 | Kosiec et al. ............... 455/260 |
| 5,696,459 A * | 12/1997 | Neugebauer et al. ........ 327/108 |
| 6,456,540 B1 * | 9/2002 | Baltar et al. ........... 365/189.09 |
| 6,590,453 B2 * | 7/2003 | Tran et al. .................... 330/255 |
| 6,727,758 B2 | 4/2004 | Govil |

FOREIGN PATENT DOCUMENTS

| | | |
|---|---|---|
| JP | 2002100936 | 4/2002 |
| KR | 20020032170 | 5/2002 |
| KR | 2005007561 | 1/2005 |

* cited by examiner

*Primary Examiner*—Patricia Nguyen
(74) *Attorney, Agent, or Firm*—Mills & Onello, LLP

(57) ABSTRACT

A regulated cascode circuit includes a first MOS transistor of a first conductive type, a second MOS transistor of the first conductive type, a third MOS transistor of a second conductive type, a first current source and a second current source. The first MOS transistor is coupled between an output node and a first node. The second MOS transistor having a gate terminal for receiving a bias voltage is coupled between the first node and a second power supply voltage. The third MOS transistor is coupled between the first power supply voltage and a gate terminal of the first MOS transistor. The first current source is coupled between the gate terminal of the first MOS transistor. The second current source is coupled between the first power supply voltage and the output node.

11 Claims, 4 Drawing Sheets

REGULATED CASCODE CIRCUITS AND CMOS ANALOG CIRCUITS INCLUDING THE SAME

CROSS-REFERENCE TO RELATED APPLICATIONS

This application claims priority under 35 U.S.C. § 119 to Korean Patent Application No. 10-2006-0018026 filed on Feb. 24, 2006, in the Korean Intellectual Property Office, the entire disclosure of which is herein incorporated by reference.

BACKGROUND OF THE INVENTION

1. Field of the Invention

The present invention relates to an analog circuit, and more particularly to a regulated cascode circuit having a stable operating characteristic at a voltage lower than 1 volt and a CMOS analog circuits including the same.

2. Description of the Related Art

Recently, there has been a trend to design system-on-chip (SoC) devices, as electronic devices rapidly become lighter and thinner to satisfy mobility and portability in a mobile environment.

An integration level of semiconductor integrated circuits has been getting higher, with demand on increased ability to store massive data and multi-functionality. At the same time, there has been an increasing need for low power circuits to reduce battery power consumption. Therefore, most of the circuits are required to operate at a voltage lower than 1 volt due to steady speed-down of the operating voltage.

However, an analog circuit needs higher voltage than a digital circuit, due to limitations of resolution and a physical configuration of analog circuits, which has been an issue in a trend toward miniaturization, and low power consumption.

Nowadays, many problems have been resolved as the result of internal company and laboratory research, so that implementing a low voltage reference or a rail-to-rail input/output circuit can be practically implemented. However, there is not such progress in research for securing a large output impedance and a large swing range.

A leakage current through a gate terminal and a channel length variation are increased by scale down of oxidation thickness and channel length, and thus it is difficult to get a sufficient voltage gain. In addition, a full output swing range of a cascode circuit is difficult to secure at a low operating voltage.

A regulated cascode circuit operating in a weak inversion region has been suggested to solve the above problems, but it is not widely used due to a problem associated with instability of operation.

FIG. 1 is a circuit diagram illustrating a prior art normal cascode circuit, and FIG. 2 is a circuit diagram illustrating a prior art regulated cascade circuit.

A circuit shown in FIG. 1 can increase an output impedance by coupling transistors MN1, MN2 in a stack structure in order to decrease a current variation according to a variation of an output voltage Vo. A sufficient output impedance, however, is difficult to obtain with only the cascode configuration, due to scale-down of semiconductor manufacturing process that cause degradation of characteristic of channel length modulation.

To overcome some of the above disadvantages, a transistor MN3 of a regulated cascode circuit illustrated in FIG. 2 receives a bias voltage from a node "X" to secure an output impedance that is about ten times larger than an output impedance of the normal cascode circuit illustrated in FIG. 1.

The regulated cascode configuration, however, causes additional loss of a swing range, because a threshold voltage becomes twice a threshold voltage of the normal cascode configuration. Therefore, the regulated cascode configuration is inefficient for low voltage operation, i.e., under about 1 volt.

The loss of the swing range of the output voltage can be reduced by causing transistor MN3 to operate in a weak inversion region. In that case, the loss of the swing range of the output voltage can be reduced. Instability of a circuit with respect to temperature variation, however, is increased when the transistor is operated in the weak inversion region, and thus it is difficult to realize a practical circuit.

SUMMARY OF THE INVENTION

In accordance with various aspects of the present invention, provided is a regulated cascode circuit of a new configuration, capable of maintaining a gain boosting characteristic of conventional regulated cascode circuit at a low operating voltage.

In accordance with various aspects of the present invention, also provided is a CMOS analog circuit including a regulated cascode circuit of a new configuration, capable of maintaining boosting characteristic of conventional regulated cascode circuit at a low operating voltage.

In accordance with an aspect of the present invention, provided is a regulated cascode circuit that includes a first MOS transistor of a first conductive type, a second MOS transistor of the first conductive type, a third MOS transistor of a second conductive type, a first current source and a second current source. The first MOS transistor is coupled between an output node and a first node. The second MOS transistor has a gate terminal configured to receive a bias voltage, and is coupled between the first node and a second power supply voltage. The third MOS transistor is coupled between a first power supply voltage and a gate terminal of the first MOS transistor. The first current source is coupled between the gate terminal of the first MOS transistor and the second power supply voltage. The second current source is coupled between the first power supply voltage and the output node.

A level of the first power supply voltage can be higher than a level of the second power supply voltage, in which the first conductive type corresponds to N type and the second conductive type corresponds to P type.

Alternatively, a level of the first power supply voltage can be lower than a level of the second power supply voltage, in which the first conductive type corresponds to P type and the second conductive type corresponds to N type.

In such a case, a threshold voltage of the third MOS transistor can be higher than a threshold voltage of the first MOS transistor and a threshold voltage of the second MOS transistor. As a result, the regulated cascode circuit can operate in a strong inversion region more stably than in weak inversion region.

A level of the first power supply voltage can be lower than a level of the second power supply voltage, the first conductive type corresponds to P type, and the second conductive type corresponds to N type.

In such a case, a threshold voltage of the third MOS transistor can be higher than a threshold voltage of the first MOS transistor and a threshold voltage of the second MOS transistor.

More generally, a threshold voltage of the third MOS transistor can be higher than a threshold voltage of the first MOS transistor and a threshold voltage of the second MOS transistor.

A voltage difference between the first power supply voltage and the second power supply voltage can be lower than about 1 volt with a good stability.

The third MOS transistor can be body-biased to have a high threshold voltage.

In accordance with another aspect of the present invention, provided is a CMOS analog circuit that includes a first current source, a first regulated cascode block, and a second regulated cascode block. The first current source is coupled between a first power supply voltage and a first node. The first regulated cascode block is coupled between the first node and a second power supply voltage and is configured to receive a voltage at the first node as a feedback bias voltage. The second regulated cascode block is coupled between an output node and the second power supply voltage. The second regulated cascode block is configured to receive the voltage at the first node as a bias voltage and and to mirror a current generated by the first current source, to output the mirrored current to the output node.

In some embodiments of the present invention, a CMOS analog circuit includes a regulated cascode pull-up block and a regulated cascode pull-down block. The regulated cascode pull-up block is coupled between a first power supply voltage and an output node and receives a bias voltage. The regulated cascode pull-down block is coupled between the output node and a second power supply voltage and receives an input voltage.

The first regulated cacode block can comprise: a first MOS transistor of a first conductive type, coupled between the output node and a second node; a second MOS transistor of the first conductive type, coupled between the second node and the second power supply voltage, the second MOS transistor having a gate terminal configured to receive the bias voltage; a third MOS transistor of a second conductive type, coupled between the first power supply voltage and a gate terminal of the first MOS transistor; a second current source coupled between the gate terminal of the first MOS transistor and the second power supply voltage; and a third current source coupled between the first power supply voltage and the output node.

In such a case, a level of the first power supply voltage can be higher than a level of the second power supply voltage, the first conductive type corresponds to N type, and the second conductive type corresponds to P type.

And a threshold voltage of the third MOS transistor can be higher than a threshold voltage of the first MOS transistor and a threshold voltage of the second MOS transistor.

Alternatively, a level of the first power supply voltage can be lower than a level of the second power supply voltage, the first conductive type corresponds to P type, and the second conductive type corresponds to N type.

In such a case, a threshold voltage of the third MOS transistor can be higher than a threshold voltage of the first MOS transistor and a threshold voltage of the second MOS transistor.

With the first regulated cascode block is configured as described above, the second regulated cascode block can comprise: a fourth MOS transistor of the first conductive type, coupled between the first node and a third node; a fifth MOS transistor of the first conductive type, coupled between the third node and the second power supply voltage, the fifth MOS transistor having a gate terminal configured to receive the bias voltage; a sixth MOS transistor of the second conductive type, coupled between the first power supply voltage and a gate terminal of the third MOS transistor; and a fourth current source coupled between the gate terminal of the third MOS transistor and the second power supply voltage.

Otherwise, regardless of the configuration of the first regulated cascode block configured, the second regulated cascode block can comprise: a first MOS transistor of a first conductive type, coupled between the first node and a second node; a second MOS transistor of the first conductive type, coupled between the second node and the second power supply voltage, the second MOS transistor having a gate terminal configured to receive the bias voltage; a third MOS transistor of a second conductive type, coupled between the first power supply voltage and a gate terminal of the first MOS transistor; and a second current source coupled between the gate terminal of the first MOS transistor and the second power supply voltage.

More generally, a level of the first power supply voltage is higher than a level of the second power supply voltage, the first conductive type corresponds to N type, and the second conductive type corresponds to P type.

In accordance with another aspect of the invention, provided is a CMOS analog circuit comprising: a regulated cascode pull-up block coupled between a first power supply voltage and an output node, the regulated cascode pull-up block receiving a bias voltage; and a regulated cascode pull-down block coupled between the output node and a second power supply voltage, the regulated cascode pull-down block configured to receive an input voltage.

The regulated pull-up block can comprise: a first MOS transistor of a first conductive type, coupled between the first power supply voltage and a first node, the first MOS transistor having a gate terminal configured to receive a bias voltage; a second MOS transistor of the first conductive type, coupled between the first node and the output node, the second MOS transistor having a gate terminal coupled to a second node; a third MOS transistor of a second conductive type, coupled between the second node and the second power supply voltage, the third MOS transistor having a gate terminal coupled to the first node; and a first current source coupled between the first power supply voltage and the second node.

In such a case, the regulated pull-down block can comprise: a fourth MOS transistor of the second conductive type, coupled between the output node and a third node, the fourth MOS transistor having a gate terminal coupled to a fourth node; a fifth MOS transistor of the second conductive type, coupled between the third node and the second power supply voltage, the fifth MOS transistor having a gate terminal configured to receive the input voltage; a sixth MOS transistor of the first conductive type, coupled between the first power supply voltage and the fourth node, the sixth MOS transistor having a gate terminal coupled to the third node; and a second current source coupled between the fourth node and the second power supply voltage.

Otherwise, regardless of the configuration of the regulated pull-up block is configured, the regulated pull-down block can comprise: a first MOS transistor of a first conductive type, coupled between the output node and a first node, the first MOS transistor having a gate terminal coupled to a second node; a second MOS transistor of the first conductive type, coupled between the first node and the second power supply voltage, the second MOS transistor having a gate terminal configured to receive the input voltage; a third MOS transistor of a second conductive type, coupled between the first power supply voltage and the second node, the third MOS transistor having a gate terminal coupled to the first node; and a first current source coupled between the second node and the second power supply voltage.

Accordingly, a large output resistance and a large swing range can be secured in a voltage lower than 1V, and a stability of operating characteristic can be obtained by using PMOS transistors of depletion type maintaining threshold voltages higher than threshold voltages of NMOS transistors.

DESCRIPTION OF THE EMBODIMENTS

Figure 1:
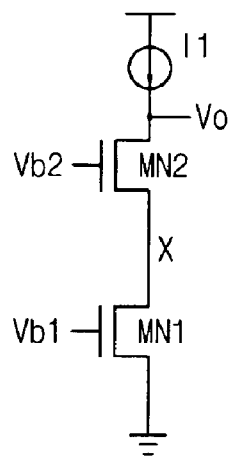
FIG. 1 is a circuit diagram illustrating a prior art normal cascode circuit.

Embodiments now will be described more fully with reference to the accompanying drawings, in which aspects of the invention are shown. The present invention can, however, be embodied in many different forms and should not be construed as limited to the embodiments set forth herein. Like reference numerals refer to like elements throughout this application.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 3:
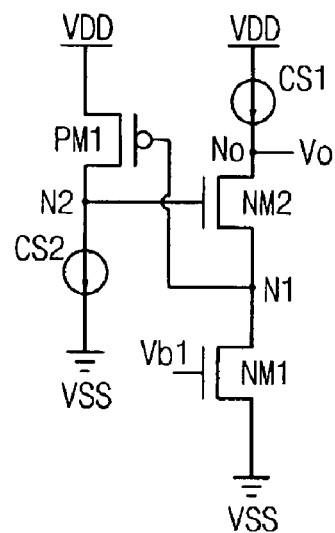
FIG. 3 is a circuit diagram illustrating an example embodiment of a regulated cascode circuit, according to aspects of the present invention.

FIG. 3 is a circuit diagram illustrating an example embodiment of a regulated cascode circuit according to aspects of the present invention.

Figure 2:
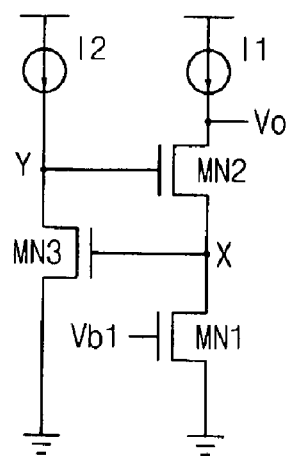
FIG. 2 is a circuit diagram illustrating a prior art regulated cascode circuit.

Comparing the circuit of FIG. 3 with the circuit of FIG. 2, the NMOS transistor MN3 in FIG. 2 is replaced by a PMOS transistor MP1, in this embodiment. Therefore, the regulated cascode circuit in FIG. 3 maintains substantially the same output impedance characteristic as the regulated cascode circuit in FIG. 2 without increasing a circuit area. In addition, the regulated cascode circuit in FIG. 3 can secure substantially the same swing range of the output voltage as the normal cascode circuit in FIG. 1.

More specifically, a current source CS1 is coupled between a power voltage VDD and an output node No. An NMOS transistor NM2 is coupled between the output node No and a first node N1, and an NMOS transistor NM1 is coupled between the first node N1 and a ground voltage VSS. The portion of the circuit including the current source CS1, the NMOS transistor NM2 and the NMOS transistor NM1 has the same configuration as the conventional normal cascode circuit in FIG. 1. However, the circuit of FIG. 3 additionally includes a PMOS transistor PM1 coupled between the power voltage VDD and a second node N2, and the second node N2 coupled to a gate terminal of the NMOS transistor NM2.

The PMOS transistor PM1 is implemented with a transistor of depletion type having a higher threshold voltage Vthp than threshold voltages Vthn1, Vthn2 of the NMOS transistors NM1, NM2, respectively.

In the configuration of FIG. 3, a voltage of the first node N1 is low enough to turn on the PMOS transistor PM1 for regulation, and thus the PMOS transistor PM1 can be operated in an inversion region without a loss of a swing range of an output voltage Vo. In addition, the regulated cascode circuit of FIG. 3 can secure substantially the same output impedance as the large output impedance of a prior art regulated cascode circuit, such as that provided in FIG. 2.

When the threshold voltage Vthp of the PMOS transistor PM1 is not high enough, an operating point of the PMOS transistor PM1 can move to a linear region, or the NMOS transistor NM2 can operate in cut-off region, thereby degrading the operation characteristic of the circuit. Therefore, a proper body-bias voltage is applied to the PMOS transistor PM1, so that the PMOS transistor PM1 can have a sufficiently high threshold voltage Vthp.

When the above conditions are satisfied, the voltage of the first node N1 corresponds to an over-drive voltage of NMOS transistor NM1, and the PMOS transistor PM1 operates in response to the voltage of the first node N1. The NMOS transistor NM2 operates in response to a voltage of the second node N2 that is applied to the gate terminal of the NMOS transistor NM2.

That is, when over-drive voltages of the NMOS transistors NM1, NM2 are determined, the required threshold voltage and over-drive voltage of PMOS transistor can be determined based on the over-drive voltages.

In the configuration of FIG. 3, the impedances of the NMOS transistors NM1 and NM2 at an output node No can be increased by as much as tens of times higher than the impedances of the prior art normal cascode circuits, such as that in FIG. 1.

Figure 4:
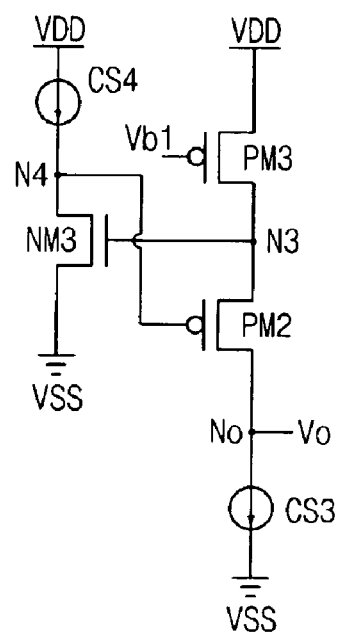
FIG. 4 is a circuit diagram illustrating another example embodiment of a regulated cascode circuit according to aspects of the present invention.

FIG. 4 is a circuit diagram illustrating another example embodiment of a regulated cascode circuit according to aspects of the present invention.

Referring to FIG. 4, a current source CS3 is coupled between a ground voltage VSS and an output node No. A PMOS transistor PM2 is coupled between the output node No and a third node N3, and a PMOS transistor PM3 is coupled between the third node N3 and a power voltage VDD. An NMOS transistor NM3 is coupled between the ground voltage VSS and a fourth node N4, and a current source CS4 is coupled between the fourth node N4 and the power voltage VDD. The fourth node N4 is coupled to a gate terminal of the PMOS transistor PM2.

Comparing the circuit of FIG. 4 with the circuit of FIG. 3, the NMOS transistors and the PMOS transistors in the circuit of FIG. 3 are replaced by the PMOS transistors and NMOS transistors in the circuit of FIG. 4. In the embodiment of FIG. 4, advantages similar to those achieved with the circuit of FIG. 3 are realized, as will be appreciated by those skilled in the art after review of FIG. 3.

Figure 5:
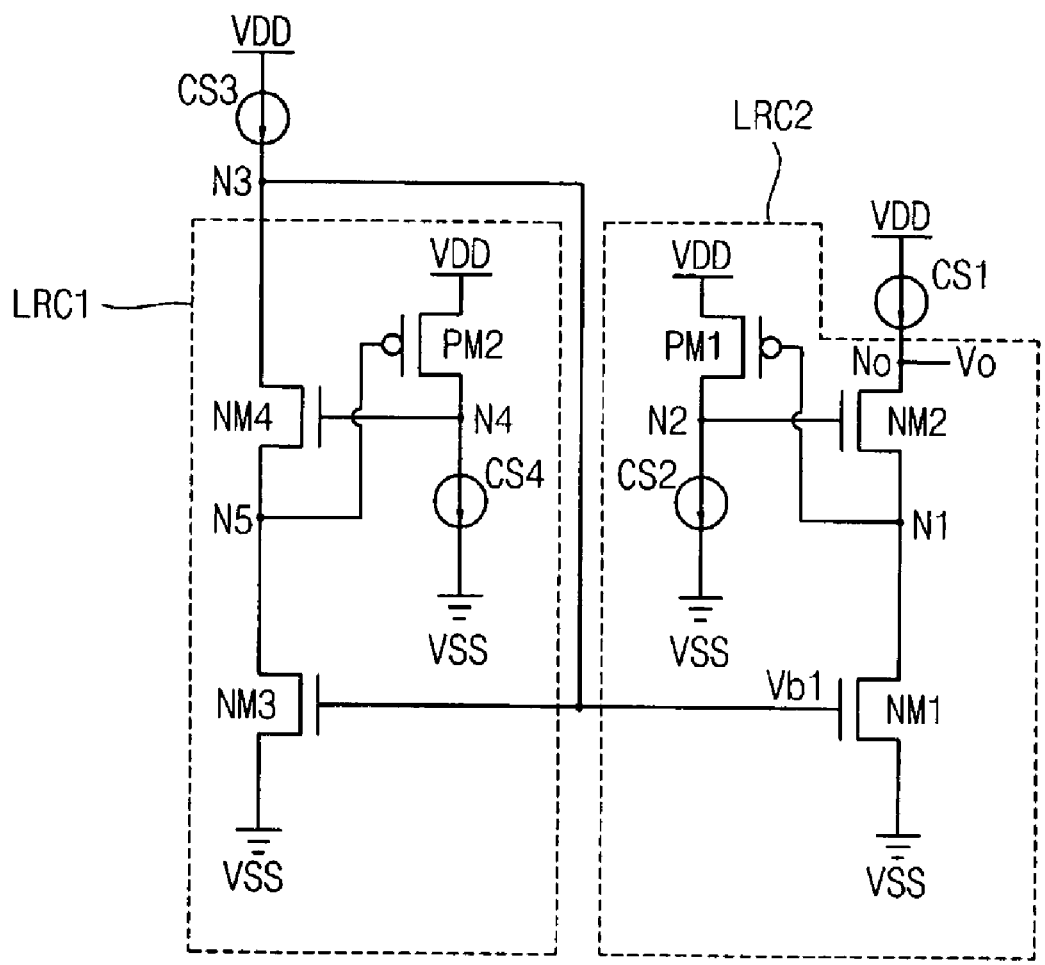
FIG. 5 is a circuit diagram illustrating an example embodiment of a current mirror including a regulated cascode circuit according to aspects of the present invention.

FIG. 5 is a circuit diagram illustrating an example embodiment of a current mirror including a regulated cascode circuit according to aspects of the present invention.

Referring to FIG. 5, the current mirror includes a current source CS3, a first regulated cascode block LRC1, and a second regulated cascode block LRC2. The current source CS3 is coupled between a power voltage VDD and a third node N3. The first regulated cascode block LRC1 is coupled between the third node N3 and a ground voltage VSS, and receives a voltage of the third node N3 as a feedback bias voltage. The second regulated cascode block LRC2 is coupled between an output node No and the ground voltage VSS, and receives the voltage of the third node N3 as a feedback bias voltage.

In the second regulated cascode block LRC2, a second NMOS transistor NM2 is coupled between the output node No and a first node N1, and a first NMOS transistor NM1 is coupled between the first node N1 and the ground voltage VSS. A PMOS transistor is coupled between the power voltage VDD and a second node N2, and a second current source CS2 is coupled between the second node N2 and a gate of the second NMOS transistor. A gate of the first transistor receives the voltage of the third node N3.

In the first regulated cascode block LRC1, a fourth NMOS transistor NM4 is coupled between the third node N3 and a fifth node N5, and a third NMOS transistor NM3 is coupled between the fifth node N5 and the ground voltage VSS. A second PMOS transistor PM2 is coupled between the power voltage and a fourth node N4, and a fourth current source CS4 is coupled between the fourth node N4 and the ground voltage VSS. The fourth node N4 is coupled to a gate of the fourth NMOS transistor. A gate of the third transistor NM3 receives the voltage of the third node N3.

In the configuration of FIG. 5, an output impedance of the NMOS transistors NM1 and NM2 at an output node can be increased by as much as tens of times larger than that of a normal cascode circuit, such as that in FIG. 1.

Figure 6:
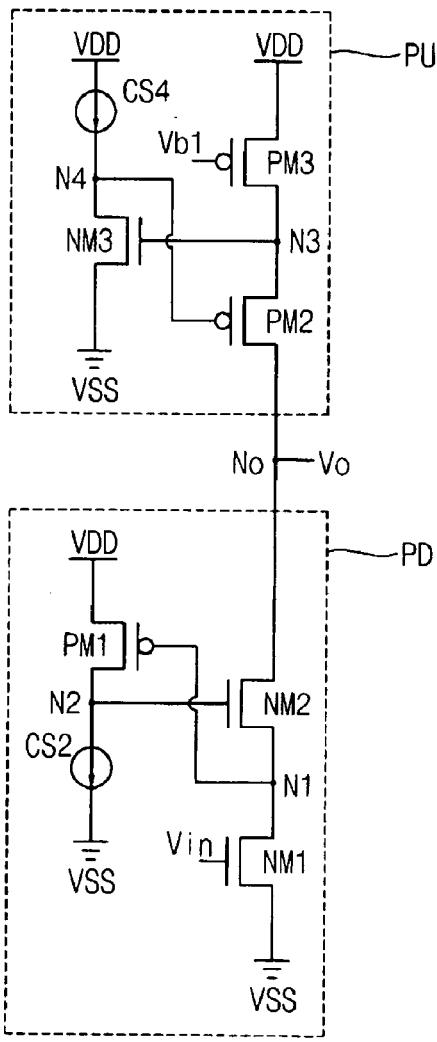
FIG. 6 is a circuit diagram illustrating an example embodiment of an output stage of an amplifier including a regulated cascode circuit according to aspects of the present invention.

FIG. 6 is a circuit diagram illustrating an example embodiment of an output stage of an amplifier including a regulated cascode circuit according to aspects of the present invention.

The output state of the amplifier includes a pull-up block PU and a pull-down block PD. In the pull-down block PD, an NMOS transistor NM2 is coupled between an output node No and a first node, and an NMOS transistor NM1 is coupled between a first node N1 and a ground voltage VSS. A PMOS transistor PM1 is coupled between a power voltage VDD and a second node N2; and a current source CS2 is coupled between the second node N2 and the ground voltage VSS. The second node N2 is coupled to a gate terminal of the NMOS transistor NM2.

In the pull-up block PU, a PMOS transistor PM2 is coupled between the output node No and a third node N3, and a PMOS transistor PM3 is coupled between the third node N3 and the power voltage VDD. An NMOS transistor NM3 is coupled between the ground voltage VSS and a fourth node N4, and a current source CS4 is coupled between the fourth node N4 and the power voltage VDD. The fourth node N4 is coupled to a gate terminal of the PMOS transistor PM2.

A bias voltage Vb1 is applied to a gate terminal of the PMOS transistor PM3, and an input signal Vin is applied to a gate terminal of the NMOS transistor NM1.

As a result, a large voltage gain can be obtained by securing a large output impedance, and stable operation of the circuit can be maintained with a large swing range.

Figure 7:
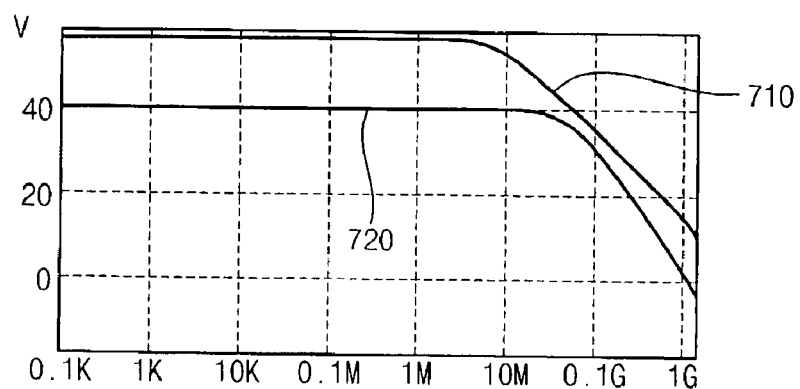
FIG. 7 is a graph illustrating a simulation result for comparing a regulated cascode circuit according to an example embodiment in accordance with aspects of the present invention with a conventional cascode circuit, as in FIG. 1.

FIG. 7 is a graph illustrating a simulation result for comparing a regulated cascode circuit according to an example embodiment of the present invention, indicated as plot 710, with a conventional cascode circuit, indicated as plot 720. The graph plots voltage "V" in dB on the vertical axis with output impedance on the horizontal axis.

As illustrated in FIG. 7, a voltage gain of about 15 dB has been realized by the regulated cascode circuit according to an embodiment of the present invention, and it is expected that more than 20 dB can be improved when optimized.

As described above, in example embodiments of the present invention, PMOS transistors of depletion type maintaining threshold voltages higher than threshold voltages of NMOS transistors are used. Thus, a large output resistance and a large swing range can be secured with a voltage lower than 1V, and a stability of operating characteristic can be obtained.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A regulated cascode circuit comprising:
    a first MOS transistor of a first conductive type, coupled between an output node and a first node;
    a second MOS transistor of the first conductive type, coupled between the first node and a second power supply voltage, the second MOS transistor having a gate terminal configured to receive a bias voltage;
    a third MOS transistor of a second conductive type, coupled between a first power supply voltage and a gate terminal of the first MOS transistor;
    a first current source coupled between the gate terminal of the first MOS transistor and the second power supply voltage; and
    a second current source coupled between the first power supply voltage and the output node.

2. The regulated cascode circuit of claim 1, wherein a level of the first power supply voltage is higher than a level of the second power supply voltage, the first conductive type corresponds to N type, and the second conductive type corresponds to P type.

3. The regulated cascode circuit of claim 2, wherein a threshold voltage of the third MOS transistor is higher than a threshold voltage of the first MOS transistor and a threshold voltage of the second MOS transistor.

4. The regulated cascode circuit of claim 1, wherein a level of the first power supply voltage is lower than a level of the second power supply voltage, the first conductive type corresponds to P type, and the second conductive type corresponds to N type.

5. The regulated cascode circuit of claim 4, wherein a threshold voltage of the third MOS transistor is higher than a threshold voltage of the first MOS transistor and a threshold voltage of the second MOS transistor.

6. The regulated cascode circuit of claim 1, wherein a threshold voltage of the third MOS transistor is higher than a threshold voltage of the first MOS transistor and a threshold voltage of the second MOS transistor.

7. The regulated cascode circuit of claim 1, wherein a voltage difference between the first power supply voltage and the second power supply voltage is lower than about 1 volt.

8. The regulated cascode circuit of claim 1, wherein the third MOS transistor is body-biased to maintain a high threshold voltage.

9. A CMOS analog circuit comprising:
a regulated cascode pull-up block coupled between a first power supply voltage and an output node, the regulated cascode pull-up block receiving a bias voltage; and
a regulated cascode pull-down block coupled between the output node and a second power supply voltage, the regulated cascode pull-down block configured to receive an input voltage, wherein the regulated cascade pull-up block comprises:
a first MOS transistor of a first conductive type, coupled between the first power supply voltage and a first node, the first MOS transistor having a gate terminal configured to receive a bias voltage;
a second MOS transistor of the first conductive type, couple between the first node and the output node, the second MOS transistor having a gate terminal couple to a second node;
a third MOS transistor of a second conductive type, coupled between the second node and the second power supply voltage, the third MOS transistor having a gate terminal coupled to the first node; and
a first current source coupled between the first power supply voltage and the second node.

10. The CMOS analog circuit of claim 9, wherein the regulated pull-down block comprises:
a fourth MOS transistor of the second conductive type, coupled between the output node and a third node, the fourth MOS transistor having a gate terminal coupled to a fourth node;
a fifth MOS transistor of the second conductive type, coupled between the third node and the second power supply voltage, the fifth MOS transistor having a gate terminal configured to receive the input voltage;
a sixth MOS transistor of the first conductive type, coupled between the first power supply voltage and the fourth node, the sixth MOS transistor having a gate terminal coupled to the third node; and
a second current source coupled between the fourth node and the second power supply voltage.

11. The CMOS analog circuit of claim 9, wherein the regulated pull-down block comprises:
a first MOS transistor of a first conductive type, coupled between the output node and a first node, the first MOS transistor having a gate terminal coupled to a second node;
a second MOS transistor of the first conductive type, coupled between the first node and the second power supply voltage, the second MOS transistor having a gate terminal configured to receive the input voltage;
a third MOS transistor of a second conductive type, coupled between the first power supply voltage and the second node, the third MOS transistor having a gate terminal coupled to the first node; and
a first current source coupled between the second node and the second power supply voltage.

* * * * *